(12) United States Patent
Yamada et al.

(10) Patent No.: US 10,510,489 B2
(45) Date of Patent: Dec. 17, 2019

(54) MOUNTING STRUCTURE AND MULTILAYER CAPACITOR BUILT-IN SUBSTRATE

(71) Applicant: Murata Manufacturing Co., Ltd., Nagaokakyo-shi, Kyoto-fu (JP)

(72) Inventors: Tadateru Yamada, Nagaokakyo (JP); Isamu Fujimoto, Nagaokakyo (JP); Kazuo Hattori, Nagaokakyo (JP); Masaru Takahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/134,053

(22) Filed: Sep. 18, 2018

(65) Prior Publication Data

US 2019/0035557 A1    Jan. 31, 2019

Related U.S. Application Data

(63) Continuation of application No. PCT/JP2017/008325, filed on Mar. 2, 2017.

(30) Foreign Application Priority Data

Mar. 18, 2016 (JP) ................................ 2016-055587
Mar. 18, 2016 (JP) ................................ 2016-055589

(51) Int. Cl.
*H01G 4/30* (2006.01)
*H01G 2/06* (2006.01)
(Continued)

(52) U.S. Cl.
CPC ................. *H01G 4/30* (2013.01); *H01G 2/06* (2013.01); *H05K 1/03* (2013.01); *H05K 1/181* (2013.01);
(Continued)

(58) Field of Classification Search
CPC ............ H01G 4/30; H01G 2/06; H01G 4/005; H01G 4/12; H05K 1/03; H05K 1/181
(Continued)

(56) References Cited

U.S. PATENT DOCUMENTS

2002/0007908 A1    1/2002  Mamada
2006/0180341 A1    8/2006  Kariya et al.
(Continued)

FOREIGN PATENT DOCUMENTS

JP          61-69409 A     4/1986
JP          8-236941 A     9/1996
(Continued)

OTHER PUBLICATIONS

Official Communication issued in International Patent Application No. PCT/JP2017/008325, dated May 9, 2017.

*Primary Examiner* — Tremesha S Willis
(74) *Attorney, Agent, or Firm* — Keating & Bennett, LLP

(57) ABSTRACT

A mounting structure includes a circuit board including one principal surface on which a multilayer capacitor is mounted. The circuit board includes a first insulating layer, and a second insulating layer having a Young's modulus smaller than that of the first insulating layer. The second insulating layer is closer to the one principal surface than the first insulating layer. A multilayer capacitor built-in substrate includes a circuit board, a multilayer capacitor on one principal surface of the circuit board, and a resin layer on the one principal surface of the circuit board and embedding the multilayer capacitor. The circuit board includes a first insulating layer, and a second insulating layer having a Young's modulus smaller than that of the first insulating layer. The second insulating layer is closer to the one principal surface than the first insulating layer.

21 Claims, 6 Drawing Sheets

(51) Int. Cl.
*H05K 1/03* (2006.01)
*H05K 1/18* (2006.01)
*H01G 4/005* (2006.01)
*H01G 4/12* (2006.01)

(52) U.S. Cl.
CPC .............. *H01G 4/005* (2013.01); *H01G 4/12* (2013.01); *H05K 2201/10015* (2013.01)

(58) Field of Classification Search
USPC ........................................................ 174/260
See application file for complete search history.

(56) References Cited

U.S. PATENT DOCUMENTS

| | | |
|---|---|---|
| 2011/0198115 A1 | 8/2011 | Azuma et al. |
| 2013/0319735 A1 | 12/2013 | Inoue et al. |
| 2014/0131081 A1* | 5/2014 | Cho ..................... H01L 21/563 174/258 |
| 2015/0096792 A1 | 4/2015 | Ogawa et al. |
| 2016/0211152 A1* | 7/2016 | Harada ............. B29C 45/14655 |

FOREIGN PATENT DOCUMENTS

| | | |
|---|---|---|
| JP | 2000-232030 A | 8/2000 |
| JP | 4504925 B2 | 7/2010 |
| JP | 2011-171436 A | 9/2011 |
| JP | 2011-216535 A | 10/2011 |
| JP | 2014-146688 A | 8/2014 |
| WO | 2012/114680 A1 | 8/2012 |
| WO | 2013/187186 A1 | 12/2013 |
| WO | 2016/035590 A1 | 3/2016 |

\* cited by examiner

FIG. 9

| | CONFIGURATION | | t0 | t1,t3 | t2 |
|---|---|---|---|---|---|
| EXEMPLARY EXPERIMENT A —— | t0 [L1] t1 | | 600μm | 600μm | - |
| EXEMPLARY EXPERIMENT B ● | t0 [L1] t1 [L2] t2 | | 600μm | 400μm | 200μm |
| EXEMPLARY EXPERIMENT C ○ | t0 [L2] t2 [L1] t1 | | 600μm | 400μm | 200μm |
| EXEMPLARY EXPERIMENT D ◌ | t0 [L3] t3 [L2] t2 [L1] t1 | | 600μm | t1: 200μm t3: 200μm | 200μm |

MOUNTING STRUCTURE AND MULTILAYER CAPACITOR BUILT-IN SUBSTRATE

CROSS REFERENCE TO RELATED APPLICATIONS

This application claims the benefit of priority to Japanese Patent Application No. 2016-055587 filed on Mar. 18, 2016 and Japanese Patent Application No. 2016-055589 filed on Mar. 18, 2016, and is a Continuation Application of PCT Application No. PCT/JP2017/008325 filed on Mar. 2, 2017. The entire contents of these applications are hereby incorporated herein by reference.

BACKGROUND OF THE INVENTION

1. Field of the Invention

The present invention relates to a mounting structure and a multilayer capacitor built-in substrate in each of which a multilayer capacitor is mounted on a circuit board.

2. Description of the Related Art

The capacitance of multilayer ceramic capacitors as electronic components has been increased with recent improvements in the performance of electronic devices. In a large-capacitance multilayer ceramic capacitor, a high-dielectric-constant ceramic material, such as barium titanate, is used as a dielectric material.

Such a high-dielectric-constant ceramic material has piezoelectric and electrostrictive properties, and thus, when voltage is applied, mechanical distortion occurs in a multilayer ceramic capacitor including a dielectric made of a high-dielectric-constant ceramic material.

Thus, when alternating-current voltage or direct-current voltage with an alternating-current component superimposed thereon is applied to the multilayer ceramic capacitor mounted on a circuit board, vibrations attributable to distortion of the multilayer ceramic capacitor are generated at the multilayer ceramic capacitor. These vibrations propagate to the circuit board, and accordingly, the circuit board vibrates.

When the circuit board vibrates at a frequency in the audible frequency range of 20 Hz to 20,000 Hz inclusive due to the propagating vibration, noise called "acoustic noise" is generated.

Various kinds of technologies have been disclosed to reduce the above-described noise. For example, Japanese Patent Application Laid-open No. 2000-232030 discloses a mounting structure in which multilayer ceramic capacitors to which equivalent voltages are applied are each mounted at plane-symmetrical positions on the front and back surfaces of the circuit board. According to Japanese Patent Application Laid-open No. 2000-232030, noise reduction is able to be achieved by causing vibration propagating from one of the multilayer ceramic capacitors to the circuit board and vibration propagating from the other multilayer ceramic capacitor to the circuit board to cancel each other.

However, the technology disclosed in Japanese Patent Application Laid-open No. 2000-232030 is applicable only when multilayer ceramic capacitors are able to be mounted on both surfaces of the circuit board, but is not applicable when a multilayer ceramic capacitor is able to be mounted on only one surface of the circuit board. This decreases the design freedom.

SUMMARY OF THE INVENTION

Preferred embodiments of the present invention provide mounting structures in each of which a multilayer capacitor is mounted on a circuit board and that are able to reduce vibrations of the entire circuit board so that noise from the circuit board is reduced without decreasing the design freedom, and multilayer capacitor built-in substrates that each is able to reduce vibrations of the entire multilayer capacitor built-in substrate so that noise from the circuit board is reduced without decreasing the design freedom.

A mounting structure according to a preferred embodiment of the present invention includes a multilayer capacitor that is mounted on one principal surface of a circuit board. The circuit board includes a first insulating layer, and a second insulating layer having a Young's modulus smaller than a Young's modulus of the first insulating layer. The second insulating layer is disposed closer to the principal surface on which the multilayer capacitor is mounted than the first insulating layer.

In a mounting structure according to a preferred embodiment of the present invention, in a process through which vibrations attributable to distortion of the multilayer capacitor propagate to the circuit board, the vibrations propagate to the first insulating layer having the higher Young's modulus through the second insulating layer having the lower Young's modulus. Accordingly, vibrations are absorbed by the second insulating layer having the lower Young's modulus, and thus, a reduced amount of vibrations propagates to the first insulating layer having the higher Young's modulus. As a result, vibrations of the entire circuit board are reduced, and thus, noise from the circuit board is reduced.

In a mounting structure according to a preferred embodiment of the present invention, a land is provided on a surface of the second insulating layer, and the multilayer capacitor is mounted on the land on the second insulating layer.

In this preferred embodiment, vibrations attributable to distortion of the multilayer capacitor first propagate to the second insulating layer having the lower Young's modulus, and thereafter propagate to the first insulating layer having the higher Young's modulus. Accordingly, the vibrations are absorbed by the second insulating layer, and thus, a reduced amount of vibrations propagates to the first insulating layer. As a result, vibrations of the entire circuit board are reduced.

In a mounting structure according to a preferred embodiment of the present invention, the circuit board further includes a third insulating layer having a Young's modulus larger than that of the second insulating layer at a position closer to the principal surface on which the multilayer capacitor is mounted than the second insulating layer. In this preferred embodiment, it is preferable that a land is provided on a surface of the third insulating layer and the multilayer capacitor is mounted on the land on the third insulating layer.

In this preferred embodiment, vibrations attributable to distortion of the multilayer capacitor first propagate to the third insulating layer having the higher Young's modulus, and propagate to the first insulating layer having the higher Young's modulus through the second insulating layer having the lower Young's modulus. Accordingly, the vibrations are absorbed by the second insulating layer, and thus, a reduced amount of vibrations propagates to the first insulating layer. As a result, vibrations of the entire circuit board are reduced.

In a mounting structure according to a preferred embodiment of the present invention, it is preferable that $E2/E1 <$ about 0.5 is satisfied where the Young's modulus of the first insulating layer is represented by E1 [GPa], and the Young's modulus of the second insulating layer is represented by E2 [GPa].

The Young's modulus difference between the first insulating layer and the second insulating layer is able to be increased by setting the ratio of the Young's modulus E2 of the second insulating layer relative to the Young's modulus E1 of the first insulating layer to be in the above-described range, thus further reducing vibrations of the entire circuit board.

In a mounting structure according to a preferred embodiment of the present invention, it is preferable that t2/t0≥about 0.08 is satisfied where a total thickness of the insulating layers included in the circuit board is represented by t0 [μm], and a thickness of the second insulating layer is represented by t2 [82 m].

The ratio of the thickness of the second insulating layer is increased by setting the ratio of the thickness t2 of the second insulating layer relative to the total thickness t0 of the insulating layers included in the circuit board to be in the above-described range, thus further reducing vibrations of the entire circuit board.

In a mounting structure according to a preferred embodiment of the present invention, it is preferable that the first insulating layer includes glass epoxy resin, and the second insulating layer includes epoxy resin.

A multilayer capacitor built-in substrate according to a preferred embodiment of the present invention includes a circuit board, a multilayer capacitor mounted on one principal surface of the circuit board, and a resin layer provided on the one principal surface of the circuit board and embedding the multilayer capacitor. The circuit board includes a first insulating layer, and a second insulating layer having a Young's modulus smaller than a Young's modulus of the first insulating layer. The second insulating layer is disposed closer to the principal surface on which the multilayer capacitor is mounted than the first insulating layer.

In a multilayer capacitor built-in substrate according to a preferred embodiment of the present invention, the circuit board is completely covered by the resin layer, and thus, vibrations attributable to distortion of the multilayer capacitor propagate not only to the circuit board but also to the resin layer. Accordingly, vibrations propagating toward the circuit board and vibrations propagating toward the resin layer cancel each other. Moreover, since the second insulating layer is provided closer to the principal surface on which the multilayer capacitor is mounted in the circuit board, the vibrations are absorbed by the second insulating layer having the lower Young's modulus. For these reasons, vibrations of the entire multilayer capacitor built-in substrate are reduced, and thus noise from the circuit board is reduced.

In a multilayer capacitor built-in substrate according to a preferred embodiment of the present invention, a land is provided on a surface of the second insulating layer, and the multilayer capacitor is mounted on the land on the second insulating layer.

In this preferred embodiment, vibrations propagating toward the circuit board first propagate to the second insulating layer having the lower Young's modulus, and thereafter, propagate to the first insulating layer having the higher Young's modulus. Accordingly, the vibrations are absorbed by the second insulating layer, and thus a reduced amount of vibrations propagates to the first insulating layer. As a result, vibrations of the entire multilayer capacitor built-in substrate are reduced.

In a multilayer capacitor built-in substrate according to a preferred embodiment of the present invention, the circuit board further includes a third insulating layer having a Young's modulus larger than that of the second insulating layer at a position closer to the principal surface on which the multilayer capacitor is mounted than the second insulating layer. In this preferred embodiment, it is preferable that a land is provided on a surface of the third insulating layer and the multilayer capacitor is mounted on the land on the third insulating layer.

In this preferred embodiment, vibrations propagating toward the circuit board first propagate to the third insulating layer having the higher Young's modulus, and propagate to the first insulating layer having the higher Young's modulus through the second insulating layer having the lower Young's modulus. Accordingly, the vibrations are absorbed by the second insulating layer, and thus, a reduced amount of vibrations propagates to the first insulating layer. As a result, vibrations of the entire multilayer capacitor built-in substrate are reduced.

In a multilayer capacitor built-in substrate according to a preferred embodiment of the present invention, it is preferable that Ei2/Ei1<about 0.5 is satisfied where the Young's modulus of the first insulating layer is represented by is represented by Ei1 [GPa], and the Young's modulus of the second insulating layer is represented by Ei2 [GPa].

The Young's modulus difference between the first insulating layer and the second insulating layer is able to be increased by setting the ratio of the Young's modulus Ei2 of the second insulating layer relative to the Young's modulus Ei1 of the first insulating layer to be in the above-described range, thus further reducing vibrations of the entire multilayer capacitor built-in substrate.

In a multilayer capacitor built-in substrate according to a preferred embodiment of the present invention, it is preferable that ti2/ti0 about 0.08 is satisfied where a total thickness of the insulating layers included in the circuit board is represented by ti0 [μm], and a thickness of the second insulating layer is represented by ti2 [μm].

The ratio of the thickness of the second insulating layer is increased by setting the ratio of the thickness ti2 of the second insulating layer relative to the total thickness ti0 of the insulating layers included in the circuit board to be in the above-described range, thus further reducing vibrations of the entire multilayer capacitor built-in substrate.

In a multilayer capacitor built-in substrate according to a preferred embodiment of the present invention, it is preferable that the first insulating layer includes glass epoxy resin, and the second insulating layer includes epoxy resin In a multilayer capacitor built-in substrate according to a preferred embodiment of the present invention, the resin layer includes a first resin layer provided on the one principal surface of the circuit board, and a second resin layer provided on the first resin layer and embedding the multilayer capacitor, and the Young's modulus of the first resin layer is smaller than that of the second resin layer.

When the first resin layer is provided on the principal surface of the circuit board on which the multilayer capacitor is mounted, vibrations are absorbed by the first resin layer having the lower Young's modulus. Accordingly, vibrations of the entire multilayer capacitor built-in substrate are reduced, and thus, noise from the circuit board is reduced.

It is preferable that the first resin layer is also provided on an upper surface and a side surface of the multilayer capacitor to cover the multilayer capacitor.

When the first resin layer having the lower Young's modulus is provided on the upper surface and the side surface of the multilayer capacitor, vibrations attributable to distortion of the multilayer capacitor are absorbed by the first resin layer, thus further reducing vibrations of the entire multilayer capacitor built-in substrate.

It is preferable that Er1/Er2<about 0.5 is satisfied where the Young's modulus of the first resin layer is represented by Er1 [GPa], and the Young's modulus of the second resin layer is represented by Er2 [GPa].

The Young's modulus difference between the first resin layer and the second resin layer is able to be increased by setting the ratio of the Young's modulus Er1 of the first resin layer relative to the Young's modulus Er2 of the second resin layer to be in the above-described range, thus further reducing vibrations of the entire multilayer capacitor built-in substrate.

It is preferable that a thickness of the first resin layer is smaller than a thickness of the multilayer capacitor.

It is preferable that the first resin layer and the second resin layer each include epoxy resin.

In a multilayer capacitor built-in substrate according to a preferred embodiment of the present invention, the resin layer is made of a single layer. In this case, it is preferable that the resin layer includes epoxy resin.

Preferred embodiments of the present invention provide mounting structures that each is able to reduce vibrations of the entire circuit board so that noise from the circuit board is reduced without decreasing the design freedom, and multilayer capacitor built-in substrates that are each able to reduce vibrations of the entire multilayer capacitor built-in substrate so that noise from the circuit board is reduced without decreasing the design freedom.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a table listing the configuration of a mounting structure in each exemplary experiment.

DETAILED DESCRIPTION OF THE PREFERRED EMBODIMENTS

Mounting structures and multilayer capacitor built-in substrates according to preferred embodiments of the present invention will be described below with reference to the drawings.

Preferred embodiments of the present invention are not limited to configurations described below, but may be modified as appropriate without departing from the scope of the present invention.

Preferred embodiments of the present invention also include a combination of two or more individual preferable configurations according to the present invention described below.

Each preferred embodiment described below is merely exemplary, and configurations described in different preferred embodiments may be partially replaced or may be combined with each other. Description of any feature that is the same or substantially the same as that of a first preferred embodiment will be omitted in a second and subsequent preferred embodiments, and description will be made only on any difference therebetween. In particular, any identical advantageous effects achieved by identical or similar configurations will not be described in all corresponding preferred embodiments.

Although each preferred embodiment below describes a case in which the multilayer capacitor is a multilayer ceramic capacitor, the multilayer capacitor is not limited to a ceramic material but may be made of any dielectric material to which distortion occurs by voltage application. Preferred embodiments of the present invention are also applicable to, for example, a multilayer metalized film capacitor that is a multilayer capacitor made of a resin material as a dielectric material other than a ceramic material.

The mounting structures according to preferred embodiments of the present invention includes a multilayer capacitor that is mounted on one principal surface of a circuit board. The circuit board includes a first insulating layer, and a second insulating layer having a Young's modulus smaller than that of the first insulating layer. The second insulating layer is disposed closer to the principal surface on which the multilayer capacitor is mounted than the first insulating layer.

First Preferred Embodiment

In a mounting structure according to a first preferred embodiment of the present invention, a land is provided on the surface of the second insulating layer, and the multilayer ceramic capacitor is mounted on the land on the second insulating layer. In other words, the second insulating layer having the lower Young's modulus is an insulating layer including a principal surface on which the multilayer ceramic capacitor is mounted.

Figure 1:
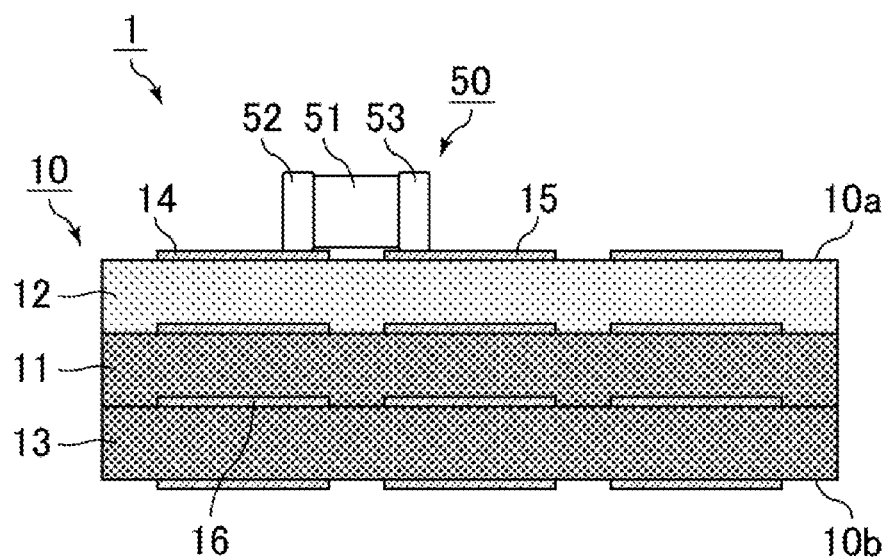
FIG. 1 is a cross-sectional view schematically illustrating a mounting structure according to a first preferred embodiment of the present invention.

FIG. 1 is a cross-sectional view schematically illustrating the mounting structure according to the first preferred embodiment of the present invention.

The mounting structure 1 illustrated in FIG. 1 includes a circuit board 10 and a multilayer ceramic capacitor 50. The multilayer ceramic capacitor 50 is mounted on one principal surface 10a of the circuit board 10.

In FIG. 1, the multilayer ceramic capacitor 50 preferably has a rectangular or substantially rectangular parallelepiped shape as a whole and includes an element body 51 and a pair of external electrodes 52 and 53.

The element body included in the multilayer ceramic capacitor preferably has a rectangular or substantially rectangular parallelepiped shape and includes a dielectric layer and an internal electrode layer alternately laminated in a predetermined direction. The dielectric layer is preferably made of, for example, a ceramic material including barium titanate ($BaTiO_3$) as a main component. The internal electrode layer is preferably made of, for example, a metallic material such as Ni, Cu, Ag, Pd, an Ag—Pd alloy, or Au.

The element body is produced by preparing a plurality of material sheets in each of which conductive paste as the internal electrode layer is printed on the surface of a ceramic sheet (green sheet) as the dielectric layer, and laminating, pressure bonding, and firing the plurality of material sheets, for example.

The material of the dielectric layer is not limited to the ceramic material including barium titanate as a main component, and may be any other high-dielectric-constant ceramic material (including, for example, $CaTiO_3$, $SrTiO_3$, or $CaZrO_3$ as a main component). The material of the internal electrode layer is not limited to the metallic material, and may be any other conductive material.

The external electrodes included in the multilayer ceramic capacitor cover both end portions of the element body and are separated from each other. Each external electrode is made of a conductive film.

Each external electrode is preferably made of a multilayer film including, for example, a sintered metal layer and a plating layer. The sintered metal layer is preferably made by baking paste, such as Cu, Ni, Ag, Pd, an Ag—Pd alloy, or Au, for example. The plating layer preferably includes, for example, a Ni plating layer, and a Sn plating layer covering the Ni plating layer. Alternatively, the plating layer may be a Cu plated layer or an Au plating layer. The external electrode may only include the plating layer.

Each external electrode may be made using conductive resin paste. When the conductive resin paste is used, a resin component included in the conductive resin paste absorbs vibrations generated in the element body so that vibrations propagating externally from the element body are able to be effectively attenuated, which is advantageous for noise reduction.

In FIG. 1, the circuit board 10 preferably has a flat plate shape as a whole, and includes a second insulating layer 12, a first insulating layer 11, and a third insulating layer 13 in this order from the principal surface 10a on which the multilayer ceramic capacitor 50 is mounted toward a principal surface 10b on which the multilayer ceramic capacitor 50 is not mounted. The first insulating layer 11 is adjacent to the second insulating layer 12, and the third insulating layer 13 is adjacent to the first insulating layer 11.

The circuit board 10 further includes lands 14 and 15 defining conductive patterns and a wire conductor 16. The lands 14 and 15 are provided on the surface of the second insulating layer 12, and the multilayer ceramic capacitor 50 is mounted on the lands 14 and 15 on the second insulating layer 12. Voltage is applied to the multilayer ceramic capacitor 50 through the conductive patterns of the circuit board 10.

The material of the first insulating layer may preferably be, for example, a resin material, such as epoxy resin or polyimide resin, a ceramic material, such as alumina, or a material obtained by adding, to these materials, a filler made of an inorganic material or an organic material. The first insulating layer preferably includes a resin material, such as a thermosetting resin, and more preferably includes glass epoxy resin impregnated with epoxy resin in glass woven fabric.

The Young's modulus of the first insulating layer is not particularly limited, but is preferably between about 20 GPa and about 30 GPa inclusive, for example.

The Young's modulus of an insulating layer such as the first insulating layer is able to be calculated by using a test piece having a width of about 25 mm and a length of about 150 mm according to JIS K 7161.

The second insulating layer is disposed closer to the principal surface on which the multilayer ceramic capacitor is mounted than the first insulating layer, and has a Young's modulus smaller than that of the first insulating layer.

The Young's modulus of the second insulating layer is not particularly limited as long as it is smaller than that of the first insulating layer, but is preferably smaller than about 10 GPa, and more preferably smaller than about 3 GPa, for example, to prevent vibration. The Young's modulus of the second insulating layer is preferably about 0.01 GPa or larger, and more preferably about 0.05 GPa or larger, for example.

The material of the second insulating layer may preferably be, for example, a resin material, such as epoxy resin, polyimide resin, or urethane resin, or a material obtained by adding, to these resin materials, a filler made of an inorganic material or an organic material. The second insulating layer preferably includes a thermosetting resin material, and more preferably includes epoxy resin. In particular, when the first insulating layer includes glass epoxy resin, the second insulating layer preferably includes epoxy resin.

The Young's modulus of an insulating layer such as the second insulating layer is able to be controlled according to, for example, the included amount of a filler made of glass or silica. Specifically, the Young's modulus is able to be increased by increasing the included amount of the filler. Thus, when glass epoxy resin is used as the material of the first insulating layer, epoxy resin in which the included amount of glass is smaller than that in the first insulating layer is preferably used as the material of the second insulating layer.

The Young's modulus of an insulating layer such as the second insulating layer is also able to be controlled by changing the kind of a resin material.

When the Young's modulus of the first insulating layer is represented by E1 [GPa], and the Young's modulus of the second insulating layer is represented by E2 [GPa], E2/E1<about 0.5 is preferably satisfied, E2/E1<about 0.33 is more preferably satisfied, E2/E1<about 0.15 is still more preferably satisfied, and E2/E1<about 0.1 is particularly more preferably satisfied, to prevent vibration.

The thickness of the second insulating layer is not particularly limited, but is preferably, for example, about 50 µm or larger, and more preferably about 100 µm or larger, to prevent vibration.

The thickness of the second insulating layer is preferably about 500 µm or smaller, for example.

When the total thickness of the insulating layers included in the circuit board is represented by t0 [µm], and the thickness of the second insulating layer is represented by t2

[µm], t2/t0 about 0.08 is preferably satisfied, and t2/t0 about 0.16 is more preferably satisfied, to prevent vibration.

It is also preferable that t2/t0 about 0.85 is satisfied.

As illustrated in FIG. 1, in the mounting structure according to the first preferred embodiment of the present invention, the circuit board may include the third insulating layer closer to the principal surface on which no multilayer ceramic capacitor is mounted than the first insulating layer.

The Young's modulus of the third insulating layer is preferably larger than that of the second insulating layer, and more preferably equal or substantially equal to the Young's modulus of the first insulating layer. Specifically, the third insulating layer is preferably made of the same material as that of the first insulating layer.

The circuit board may be formed by, for example, a lump layering method or a build-up method. When the circuit board is formed by the lump layering method, first, a plurality of insulating layers on each of which a conductive pattern is formed is prepared. Then, the insulating layers are laminated and pressure bonded so that the second insulating layer is disposed closer to the principal surface on which the multilayer ceramic capacitor is to be mounted, and then, the resin material is thermally cured or the ceramic material is fired to form the circuit board. When the circuit board is formed by the build-up method, first, a support substrate such as a glass epoxy resin substrate is prepared, and conductive layers are formed on both surfaces of the support substrate with bonding layers of prepreg interposed therebetween. Then, formation of a conductive pattern by patterning of the conductive layer by using photolithography and a resist film and lamination of an insulating layer are repeated to form the circuit board.

In FIG. 1, the lands 14 and 15 are positioned separately from each other on the one principal surface 10a of the circuit board 10 on which the multilayer ceramic capacitor 50 is mounted. The lands 14 and 15 correspond to portions of a conductive pattern, and are arranged on the second insulating layer 12 for the external electrodes 52 and 53 of the multilayer ceramic capacitor 50. Various conductive materials may be used as the material of the lands 14 and 15, and typically, a metallic material, such as copper foil, is preferably used.

The external electrode 52 of the multilayer ceramic capacitor 50 and the land 14 provided to the circuit board 10 are bonded to each other through a conductive bonding member. Similarly, the external electrode 53 of the multilayer ceramic capacitor 50 and the land 15 provided to the circuit board 10 are bonded to each other through a conductive bonding member. These bonding members may be, for example, a conductive adhesive or solder. When a conductive adhesive is used as the bonding members, a resin component included in the conductive adhesive absorbs vibrations generated at the multilayer ceramic capacitor so that vibrations propagating from the multilayer ceramic capacitor to the outside are able to be effectively attenuated, which is advantageous for noise reduction.

The structure of the mounting structure 1 illustrated in FIG. 1 is merely an example of that of the mounting structure according to the first preferred embodiment of the present invention. The number of laminated insulating layers, disposition of a conductive pattern, and other features and characteristics may be changed in various manners as long as the second insulating layer having the lower Young's modulus is an insulating layer having a principal surface on which the multilayer ceramic capacitor is mounted, and the first insulating layer having the higher Young's modulus is disposed closer to the principal surface on which the multilayer ceramic capacitor is not mounted.

For example, the first insulating layer does not need to be adjacent to the second insulating layer, and an insulating layer having a Young's modulus smaller than that of the second insulating layer may be disposed between the first insulating layer and the second insulating layer. The third insulating layer does not need to be included, and the mounting structure may have a two-layer structure including the first insulating layer and the second insulating layer. In addition, an insulating layer other than the third insulating layer may be provided closer to the principal surface on which no multilayer ceramic capacitor is mounted than the third insulating layer.

When another insulating layer other than the first insulating layer and the second insulating layer is provided, the Young's modulus of the other insulating layer is preferably larger than that of the second insulating layer, and more preferably equal to the Young's modulus of the first insulating layer, similarly to that of the third insulating layer.

Thus, an insulating layer included in the principal surface on which no multilayer ceramic capacitor is mounted preferably has a higher Young's modulus.

Second Preferred Embodiment

In a mounting structure according to a second preferred embodiment of the present invention, the circuit board further includes a third insulating layer having a Young's modulus larger than that of the second insulating layer at a position closer to the principal surface on which the multilayer ceramic capacitor is mounted than the second insulating layer. In other words, the second insulating layer having the lower Young's modulus is sandwiched between the first insulating layer and the third insulating layer each having the higher Young's modulus.

The following describes a case in which a land is provided on the surface of the third insulating layer and the multilayer ceramic capacitor is mounted on the land on the third insulating layer. In this case, the third insulating layer having the higher Young's modulus is an insulating layer having a principal surface on which the multilayer ceramic capacitor is mounted.

Figure 2:
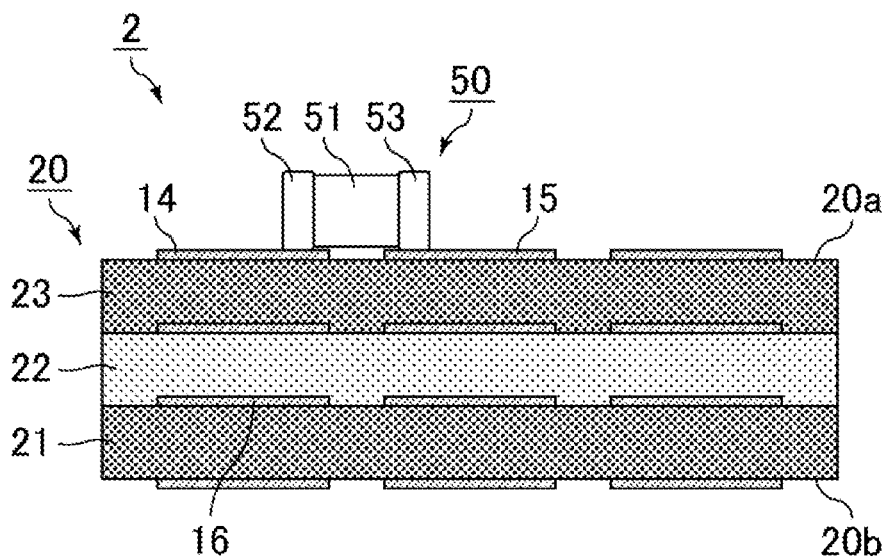
FIG. 2 is a cross-sectional view schematically illustrating a mounting structure according to a second preferred embodiment of the present invention.

FIG. 2 is a cross-sectional view schematically illustrating a mounting structure according to the second preferred embodiment of the present invention.

The mounting structure 2 illustrated in FIG. 2 includes a circuit board 20 and the multilayer ceramic capacitor 50, and the multilayer ceramic capacitor 50 is mounted on one principal surface 20a of the circuit board 20.

In the mounting structure according to the second preferred embodiment of the present invention, the configuration of the multilayer ceramic capacitor is the same or substantially the same as that of the mounting structure according to the first preferred embodiment of the present invention.

In FIG. 2, the circuit board 20 preferably has a flat plate shape as a whole, and includes a third insulating layer 23, a second insulating layer 22, and a first insulating layer 21 in the stated order from the principal surface 20a on which the multilayer ceramic capacitor 50 is mounted toward a principal surface 20b on which the multilayer ceramic capacitor 50 is not mounted. The first insulating layer 21 is adjacent to the second insulating layer 22, and the second insulating layer 22 is adjacent to the third insulating layer 23.

The circuit board 20 further includes the lands 14 and 15 as conductive patterns, and the wire conductor 16. The lands 14 and 15 are provided on the surface of the third insulating layer 23, and the multilayer ceramic capacitor 50 is mounted on the lands 14 and 15 on the third insulating layer 23.

In the mounting structure according to the second preferred embodiment of the present invention, the configuration of the circuit board is the same or substantially the same as that of the mounting structure according to the first preferred embodiment of the present invention, except that the first insulating layer, the second insulating layer, and the third insulating layer are disposed in a different order.

Accordingly, the preferable material and Young's modulus of the first insulating layer, the preferable material, Young's modulus, and thickness of the second insulating layer, and the preferable material and Young's modulus of the third insulating layer are the same or substantially the same as those of the mounting structure according to the first preferred embodiment of the present invention.

The structure of the mounting structure 2 illustrated in FIG. 2 is merely an example of that of the mounting structure according to the second preferred embodiment of the present invention. The number of laminated insulating layers, disposition of a conductive pattern, and other features and characteristics may be changed in various manners as long as the second insulating layer having the lower Young's modulus is sandwiched between the first insulating layer and the third insulating layer each having the higher Young's modulus.

For example, the multilayer ceramic capacitor does not need to be mounted on a land on the third insulating layer, but an insulating layer having a Young's modulus smaller than the Young's modulus of the third insulating layer may be disposed closer to the principal surface on which the multilayer ceramic capacitor is mounted than the third insulating layer, and the multilayer ceramic capacitor may be mounted on a land on the insulating layer. The first insulating layer does not need to be adjacent to the second insulating layer, and the second insulating layer does not need to be adjacent to the third insulating layer. In addition, another insulating layer may be disposed closer to the principal surface on which no multilayer ceramic capacitor is mounted than the first insulating layer.

When another insulating layer other than the first insulating layer, the second insulating layer, and the third insulating layer is provided, the Young's modulus of the other insulating layer is preferably larger than the Young's modulus of the second insulating layer, and more preferably equal or substantially equal to the Young's modulus of the first insulating layer, similarly to that of the third insulating layer. Thus, an insulating layer included in the principal surface on which no multilayer ceramic capacitor is mounted preferably has a higher Young's modulus.

The preferred embodiments of the mounting structure according to the present invention are described above, but the mounting structure according to the present invention is not limited to the above-described preferred embodiments.

In mounting structures according to preferred embodiments of the present invention, when alternating-current voltage or direct-current voltage with an alternating-current component superimposed thereon is applied to the multilayer capacitor, vibrations of the entire circuit board are able to be reduced so that noise from the circuit board is reduced. Thus, the circuit boards included in the mounting structures according to preferred embodiments of the present invention are preferably substrates each provided with a conductive pattern to which alternating-current voltage or direct-current voltage with an alternating-current component superimposed thereon is applied, and particularly, substrates each provided with a conductive pattern with which the voltage applied to the multilayer capacitor varies at a frequency in the audible frequency range of 20 Hz to 20,000 Hz inclusive.

Although the above-described preferred embodiments each describe a mounting structure in which one multilayer capacitor is mounted on one principal surface of the circuit board, but preferred embodiments of the present invention also include a mounting structure in which a plurality of multilayer capacitors is mounted on one principal surface of the circuit board. In addition, an electronic component other than a multilayer capacitor may be mounted on the circuit board.

The following describes a case in which multilayer capacitors are mounted on both principal surfaces of the circuit board in a mounting structure according to a preferred embodiment of the present invention.

First, when the number of mounted multilayer capacitors is different between both principal surfaces, a principal surface on which the larger number of multilayer capacitors are mounted is referred to as a "principal surface on which multilayer capacitors are mounted", and the other principal surface on which the smaller number of multilayer capacitors are mounted is referred to as a "principal surface on which no multilayer capacitors are mounted". In this case, a preferred embodiment of the present invention includes a configuration in which an insulating layer having the lower Young's modulus is disposed closer to the principal surface on which multilayer capacitors are mounted, and an insulating layer having the higher Young's modulus is disposed closer to the principal surface on which no multilayer capacitors are mounted. In this case, the number of multilayer capacitors closer to the "principal surface on which multilayer capacitors are mounted" is preferably about five times larger than the number of multilayer capacitors closer to the "principal surface on which no multilayer capacitors are mounted".

When the number of mounted multilayer capacitors is the same or substantially the same between both principal surfaces, each principal surface is referred to as a "principal surface on which multilayer capacitors are mounted". In this case, a preferred embodiment of the present invention includes a configuration in which an insulating layer having the lower Young's modulus is disposed closer to the principal surface on which multilayer capacitors are mounted, and an insulating layer having the higher Young's modulus is disposed closer to the opposite principal surface.

Thus, for example, in the mounting structure according to the second preferred embodiment of the present invention, multilayer capacitors may be mounted on both principal surfaces when insulating layers at both principal surfaces have the higher Young's modulus and an insulating layer disposed therebetween has the lower Young's modulus.

Even when an insulating layer having the higher Young's modulus is disposed at one principal surface, and an insulating layer having the lower Young's modulus is disposed at the other principal surface, a configuration in which an insulating layer having the lower Young's modulus is disposed other than the insulating layer at the other principal surface and sandwiched between the insulating layers having the higher Young's modulus may be recognized as a combination of the mounting structural bodies according to the first and second preferred embodiments of the present invention, and thus, multilayer capacitors may be mounted on both principal surfaces.

In the mounting structure according to the first preferred embodiment of the present invention, multilayer capacitors may be mounted on both principal surfaces when insulating layers at both principal surfaces have the lower Young's modulus and an insulating layer disposed therebetween has the higher Young's modulus.

Multilayer capacitor built-in substrates according to preferred embodiments of the present invention each preferably include a circuit board, a multilayer capacitor mounted on one principal surface of the circuit board, and a resin layer provided on the one principal surface of the circuit board and embedding the multilayer capacitor. The circuit board includes a first insulating layer, and a second insulating layer having a Young's modulus smaller than a Young's modulus of the first insulating layer. The second insulating layer is disposed closer to the principal surface on which the multilayer capacitor is mounted than the first insulating layer.

Third Preferred Embodiment

In a multilayer capacitor built-in substrate according to a third preferred embodiment of the present invention, the resin layer on the circuit board includes a first resin layer provided on one principal surface of the circuit board, and a second resin layer provided on the first resin layer and embedding the multilayer capacitor.

In the multilayer capacitor built-in substrate according to the third preferred embodiment of the present invention, a land is provided on the surface of the second insulating layer included in the circuit board, and the multilayer ceramic capacitor is mounted on the land on the second insulating layer. In other words, the second insulating layer having the lower Young's modulus is an insulating layer having a principal surface on which the multilayer ceramic capacitor is mounted.

Figure 3:
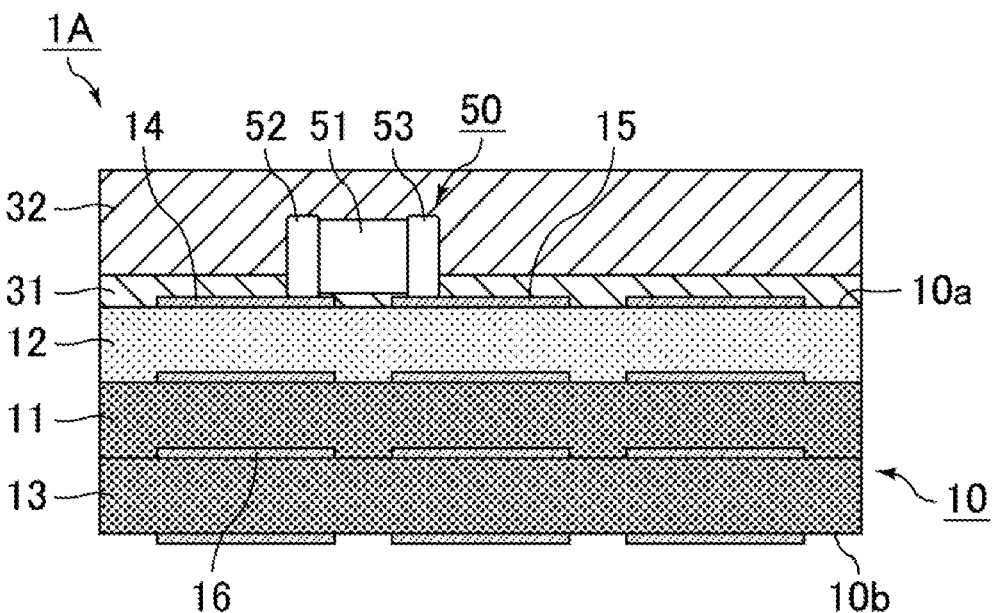
FIG. 3 is a cross-sectional view schematically illustrating an exemplary multilayer capacitor built-in substrate according to a third preferred embodiment of the present invention.

FIG. 3 is a cross-sectional view schematically illustrating an exemplary multilayer capacitor built-in substrate according to the third preferred embodiment of the present invention.

This multilayer capacitor built-in substrate 1A illustrated in FIG. 3 includes the circuit board 10, the multilayer ceramic capacitor 50, a first resin layer 31, and a second resin layer 32.

Although not illustrated in FIG. 3, a conductive portion may be additionally provided on the surface of the second resin layer 32.

The multilayer ceramic capacitor 50 is mounted on the one principal surface 10a of the circuit board 10. The first resin layer 31 is provided on the one principal surface 10a of the circuit board 10. The second resin layer 32 is provided on the first resin layer 31 and embeds the multilayer ceramic capacitor 50.

In FIG. 3, the multilayer ceramic capacitor 50 preferably has a rectangular or substantially rectangular parallelepiped shape as a whole, and includes the element body 51 and the pair of external electrodes 52 and 53.

The element body included in the multilayer ceramic capacitor preferably has a rectangular or substantially rectangular parallelepiped shape and includes a dielectric layer and an internal electrode layer alternately laminated in a predetermined direction. The dielectric layer is preferably made of, for example, a ceramic material including barium titanate ($BaTiO_3$) as a main component. The internal electrode layer is preferably made of a metallic material such as, for example, Ni, Cu, Ag, Pd, an Ag—Pd alloy, or Au.

The element body preferably is produced by preparing a plurality of material sheets in each of which conductive paste as the internal electrode layer is printed on the surface of a ceramic sheet (what is called green sheet) as the dielectric layer, and laminating, pressure bonding, and firing the plurality of material sheets, for example.

The material of the dielectric layer is not limited to the above-described ceramic material including barium titanate as a main component, but may be any other high-dielectric-constant ceramic material (including, for example, $CaTiO_3$, $SrTiO_3$, or $CaZrO_3$ as a main component). The material of the internal electrode layer is not limited to the above-described metallic material, but may be any other conductive material.

The external electrodes included in the multilayer ceramic capacitor cover both end portions of the element body and are separated from each other. Each external electrode is preferably made of a conductive film.

Each external electrode is preferably made of a multilayer film including, for example, a sintered metal layer and a plating layer. The sintered metal layer is preferably formed by baking paste such as Cu, Ni, Ag, Pd, an Ag—Pd alloy, or Au. The plating layer preferably includes, for example, a Ni plating layer, and a Sn plating layer covering the Ni plating layer. Alternatively, the plating layer may be a Cu plated layer or an Au plating layer. The external electrode may only include the plating layer.

Each external electrode may preferably be made using conductive resin paste, for example. When the conductive resin paste is used, a resin component included in the conductive resin paste absorbs vibrations generated in the element body so that vibrations propagating externally from the element body are able to be effectively attenuated, which is advantageous for noise reduction.

In FIG. 3, the circuit board 10 preferably has a flat plate shape as a whole, and includes the second insulating layer 12, the first insulating layer 11, and the third insulating layer 13 in order from the principal surface 10a on which the multilayer ceramic capacitor 50 is mounted toward the principal surface 10b on which the multilayer ceramic capacitor 50 is not mounted. The first insulating layer 11 is adjacent to the second insulating layer 12, and the third insulating layer 13 is adjacent to the first insulating layer 11.

The circuit board 10 further includes the lands 14 and 15 defining conductive patterns and the wire conductor 16. The lands 14 and 15 are provided on the surface of the second insulating layer 12, and the multilayer ceramic capacitor 50 is mounted on the lands 14 and 15 on the second insulating layer 12. Voltage is applied to the multilayer ceramic capacitor 50 through the conductive patterns of the circuit board 10.

The material of the first insulating layer may preferably be, for example, a resin material, such as epoxy resin or polyimide resin, a ceramic material, such as alumina, or a material obtained by adding, to these materials, a filler made of an inorganic material or an organic material. The first insulating layer preferably includes a resin material, such as a thermosetting resin, and more preferably includes glass epoxy resin impregnated with epoxy resin in glass woven fabric.

The Young's modulus of the first insulating layer is not particularly limited, but is preferably between about 20 GPa and about 30 GPa inclusive, for example.

The Young's modulus of an insulating layer such as the first insulating layer is able to be calculated using a test piece having a width of about 25 mm and a length of about 150 mm according to JIS K 7161.

The second insulating layer is disposed closer to the principal surface on which the multilayer ceramic capacitor is mounted than the first insulating layer, and has a Young's modulus smaller than that of the first insulating layer.

The Young's modulus of the second insulating layer is not particularly limited as long as it is smaller than that of the first insulating layer, but is preferably, for example, smaller than about 10 GPa, and more preferably smaller than about 3 GPa, to prevent vibration. The Young's modulus of the second insulating layer is preferably, for example, about 0.01 GPa or larger, and more preferably 0.05 GPa or larger.

The material of the second insulating layer may preferably be, for example, a resin material such as epoxy resin, polyimide resin, or urethane resin, or a material obtained by adding, to these resin materials, a filler made of an inorganic material or an organic material. The second insulating layer preferably includes a thermosetting resin material, and more preferably contains epoxy resin, for example. In particular, when the first insulating layer includes glass epoxy resin, the second insulating layer preferably includes epoxy resin.

The Young's modulus of an insulating layer such as the second insulating layer is able to be controlled according to, for example, the included amount of a filler made of glass or silica. Specifically, the Young's modulus is able to be increased by increasing the included amount of the filler. Thus, when glass epoxy resin is used as the material of the first insulating layer, epoxy resin in which the included amount of glass is smaller than that in the first insulating layer is preferably used as the material of the second insulating layer.

The Young's modulus of an insulating layer such as the second insulating layer is also able to be controlled by changing the kind of a resin material.

When the Young's modulus of the first insulating layer is represented by $Ei1$ [GPa], and the Young's modulus of the second insulating layer is represented by $Ei2$ [GPa], $Ei2/Ei1<$about 0.5 is preferably satisfied, $Ei2/Ei1<$about 0.33 is more preferably satisfied, $Ei2/Ei1<0.15$ is still more preferably satisfied, and $Ei2/Ei1<$about 0.1 is particularly more preferably satisfied, for example, to prevent vibration.

The thickness of the second insulating layer is not particularly limited, but is preferably about 50 μm or larger, and more preferably about 100 μm or larger, for example, to prevent vibration. The thickness of the second insulating layer is preferably about 500 μm or smaller, for example.

When the total thickness of the insulating layers included in the circuit board is represented by $ti0$ [μm], and the thickness of the second insulating layer is represented by $ti2$ [μm], $ti2/ti0$ about 0.08 is preferably satisfied, and $ti2/ti0$ about 0.16 is more preferably satisfied, for example, to prevent vibration. It is also preferable that $ti2/ti0$ about 0.85 is satisfied, for example.

As illustrated in FIG. 3, in the multilayer capacitor built-in substrate according to the third preferred embodiment of the present invention, the circuit board may include the third insulating layer closer to the principal surface on which no multilayer ceramic capacitor is mounted than the first insulating layer.

The Young's modulus of the third insulating layer is preferably larger than that of the second insulating layer, and more preferably equal or substantially equal to the Young's modulus of the first insulating layer. Specifically, the third insulating layer is preferably made of the same material as that of the first insulating layer.

The circuit board may be formed by, for example, a lump layering method or a build-up method. When the circuit board is formed by the lump layering method, first, a plurality of insulating layers on each of which a conductive pattern is formed is prepared. Then, the insulating layers are laminated and pressure bonded so that the second insulating layer is disposed closer to the principal surface on which the multilayer ceramic capacitor is to be mounted, and then, the resin material is thermally cured or the ceramic material is fired to form the circuit board. When the circuit board is formed by the build-up method, first, a support substrate such as a glass epoxy resin substrate is prepared, and conductive layers are formed on both surfaces of the support substrate with bonding layers of prepreg interposed therebetween. Then, formation of a conductive pattern by patterning of the conductive layer by using photolithography and a resist film and lamination of an insulating layer are repeated to form the circuit board.

In FIG. 3, the lands 14 and 15 are positioned separately from each other on the one principal surface 10a of the circuit board 10 on which the multilayer ceramic capacitor 50 is mounted. The lands 14 and 15 correspond to portions of a conductive pattern, and are arranged on the second insulating layer 12 for the external electrodes 52 and 53 of the multilayer ceramic capacitor 50. Various conductive materials may be used as the material of the lands 14 and 15, and typically, a metallic material, such as copper foil, for example, is preferably used.

The external electrode 52 of the multilayer ceramic capacitor 50 and the land 14 provided to the circuit board 10 are bonded to each other through a conductive bonding member. Similarly, the external electrode 53 of the multilayer ceramic capacitor 50 and the land 15 provided to the circuit board 10 are bonded to each other through a conductive bonding member. These bonding members may preferably be, for example, a conductive adhesive or solder. When a conductive adhesive is used as the bonding members, a resin component included in the conductive adhesive absorbs vibrations generated at the multilayer ceramic capacitor so that vibrations propagating from the multilayer ceramic capacitor to the outside are able to be effectively attenuated, which is advantageous for noise reduction.

In FIG. 3, the first resin layer 31 is provided entirely or substantially entirely on the one principal surface 10a of the circuit board 10 on which the multilayer ceramic capacitor 50 is mounted.

In this manner, the first resin layer is preferably provided entirely or substantially on the principal surface of the circuit board on which the multilayer ceramic capacitor is mounted. In other words, the principal surface of the circuit board on which the multilayer ceramic capacitor is mounted is preferably covered by the first resin layer.

Figure 4:
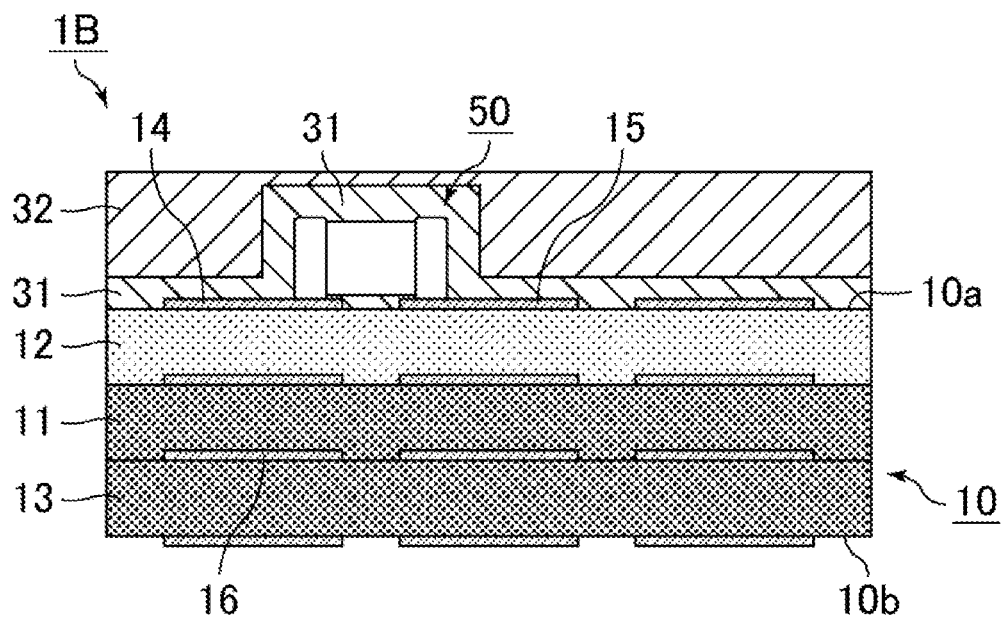
FIG. 4 is a cross-sectional view schematically illustrating another exemplary multilayer capacitor built-in substrate according to the third preferred embodiment of the present invention.

FIG. 4 is a cross-sectional view schematically illustrating another exemplary multilayer capacitor built-in substrate according to the third preferred embodiment of the present invention.

In the multilayer capacitor built-in substrate 1B illustrated in FIG. 4, the first resin layer 31 is provided on the upper surface and the side surface of the multilayer ceramic capacitor 50 to cover the multilayer ceramic capacitor 50.

The first resin layer only needs to be in contact with a portion of the multilayer ceramic capacitor as illustrated in FIG. 3, but is preferably provided on the upper surface and the side surface of the multilayer ceramic capacitor, and more preferably provided entirely or substantially entirely on the upper surface and side surface of the multilayer ceramic capacitor, to cover the multilayer ceramic capacitor as illustrated in FIG. 4.

The Young's modulus of the first resin layer is smaller than that of the second resin layer.

The Young's modulus of the first resin layer is not particularly limited as long as it is smaller than that of the second resin layer, but is preferably smaller than about 10 GPa, and more preferably smaller than 3 GPa, for example, to prevent vibration. The Young's modulus of the first resin layer is preferably about 0.01 GPa or larger, and more preferably about 0.05 GPa or larger, for example.

The Young's modulus of a resin layer such as the first resin layer is able to be calculated using a test piece having a width of about 25 mm and a length of about 150 mm according to JIS K 7161.

The material of the first resin layer may preferably be, for example, a resin material such as epoxy resin, polyimide resin, or urethane resin, or a material obtained by adding, to these resin materials, a filler made of an inorganic material or an organic material. The first resin layer preferably includes a thermosetting resin material, and more preferably includes epoxy resin, for example.

The Young's modulus of a resin layer such as the first resin layer is able to be controlled according to, for example, the included amount of a filler made of glass or silica. Specifically, the Young's modulus is able to be increased by increasing the included amount of the filler. The Young's modulus of a resin layer such as the first resin layer is also able to be controlled by changing the kind of a resin material.

When the Young's modulus of the first resin layer is represented by $Er1$ [GPa] and the Young's modulus of the second resin layer is represented by $Er2$ [GPa], $Er1/Er2$<about 0.5 is preferably satisfied, and $Er1/Er2$<about 0.33 is more preferably satisfied, for example, to prevent vibration.

The thickness of the first resin layer is not particularly limited, but is preferably smaller than the thickness of the multilayer ceramic capacitor, and more preferably about half or less of the thickness of the multilayer ceramic capacitor. Specifically, the thickness of the first resin layer is preferably about 300 μm or smaller, and more preferably 200 μm or smaller, for example. The thickness of the first resin layer is preferably about 50 μm or larger, for example.

When the first resin layer is provided on the upper surface and the side surface of the multilayer ceramic capacitor, the thickness of the first resin layer on the upper surface and side surface of the multilayer ceramic capacitor is preferably equal or substantially equal to the thickness of the first resin layer on the circuit board.

When the total thickness of the resin layers is represented by $tr0$ [μm] and the thickness of the first resin layer is represented by $tr1$ [μm], $tr1/tr0$ about 0.03 is preferably satisfied, and $tr1/tr0$ about 0.16 is more preferably satisfied, for example, to prevent vibration. It is also preferable that $tr1/tr0$ about 0.85 is satisfied, for example.

In FIG. 3, the second resin layer 32 directly embeds the multilayer ceramic capacitor 50. In other words, the multilayer ceramic capacitor 50 is directly covered by the second resin layer 32.

However, the second resin layer does not need to directly embed the multilayer ceramic capacitor, and may embed the multilayer ceramic capacitor covered by the first resin layer as illustrated in FIG. 4.

Similarly to the material of the first resin layer, the material of the second resin layer may preferably be, for example, a resin material such as epoxy resin, polyimide resin, or urethane resin, or a material obtained by adding, to these resin materials, a filler made of an inorganic material or an organic material. The second resin layer preferably includes the same or substantially the same thermosetting resin material as that of the first resin layer, and more preferably includes epoxy resin. Specifically, the material of the second resin layer is preferably epoxy resin in which the included amount of a filler made of glass or silica is larger than in the first resin layer. The material of the first resin layer may be epoxy resin that does not include the filler or may be epoxy resin in which the included amount of the filler is smaller than in the second resin layer.

The Young's modulus of the second resin layer is not particularly limited as long as it is larger than that of the first resin layer, but is, for example, preferably about 10 GPa or larger, and more preferably 15 GPa or larger. The Young's modulus of the second resin layer is also preferably about 30 GPa or smaller, and more preferably about 25 GPa or smaller, for example.

The thickness of the second resin layer only needs to be enough to embed the multilayer ceramic capacitor, and may be selected as appropriate in accordance with the thickness of the multilayer ceramic capacitor and the thickness of the first resin layer.

For example, the thickness of the second resin layer is preferably about 1 mm or smaller, and more preferably about 800 μm or smaller. The thickness of the second resin layer is also preferably about 500 μm or larger, for example.

The thickness of the second resin layer is the thickness of a portion at which the multilayer ceramic capacitor is not provided, and thus is the thickness of the second resin layer provided on the first resin layer on the circuit board.

The first resin layer and the second resin layer may be formed by, for example, a method described below. First, the circuit board on which the multilayer ceramic capacitor is mounted is prepared. In addition, first resin (for example, epoxy resin) and second resin (for example, epoxy resin with an added filler) having a Young's modulus larger than that of first resin are prepared. The first resin and the second resin are preferably liquid, and the viscosity of the second resin is preferably higher than that of the first resin. Subsequently, the first resin is applied on the principal surface of the circuit board on which the multilayer ceramic capacitor is mounted, and then cured to form the first resin layer on one principal surface of the circuit board. The first resin layer may be formed also on the upper surface and side surface of the multilayer ceramic capacitor. Subsequently, the second resin is applied on the first resin layer to completely cover the multilayer ceramic capacitor, and then is cured to form the second resin layer embedding the multilayer ceramic capacitor.

The first resin and the second resin may be sheets. In this case, a first resin sheet is disposed on the principal surface of the circuit board on which the multilayer ceramic capacitor is mounted, and a second resin sheet is disposed on the first resin sheet, and then these resin sheets are cured, so that the first resin layer and the second resin layer are able to be formed.

After the second resin layer is formed, grinding processing may be performed to flatten the surface of the second resin layer.

The structures of the multilayer capacitor built-in substrates illustrated in FIGS. 3 and 4 are merely examples of the multilayer capacitor built-in substrate according to preferred embodiments of the present invention. The number of laminated insulating layers, disposition of a conductive pattern, and other features and characteristics may be changed in various manners as long as the second insulating layer having the lower Young's modulus is an insulating layer having a principal surface on which the multilayer ceramic capacitor is mounted, and the first insulating layer having the higher Young's modulus is disposed closer to the principal surface on which the multilayer ceramic capacitor is not mounted.

For example, the first insulating layer does not need to be adjacent to the second insulating layer, and an insulating layer having a Young's modulus smaller than that of the second insulating layer may be disposed between the first insulating layer and the second insulating layer. The third insulating layer does not need to be disposed, and the mounting structure may have a two-layer structure including the first insulating layer and the second insulating layer. In addition, an insulating layer other than the third insulating layer may be disposed closer to the principal surface on which no multilayer ceramic capacitor is mounted than the third insulating layer.

When another insulating layer other than the first insulating layer and the second insulating layer is provided, the Young's modulus of the other insulating layer is preferably larger than that of the second insulating layer, and more preferably equal or substantially equal to the Young's modulus of the first insulating layer, similarly to that of the third insulating layer.

Thus, an insulating layer included in the principal surface on which no multilayer ceramic capacitor is mounted preferably has a higher Young's modulus.

Fourth Preferred Embodiment

In a multilayer capacitor built-in substrate according to a fourth preferred embodiment of the present invention, similarly to the multilayer capacitor built-in substrate according to the third preferred embodiment of the present invention, the resin layer on the circuit board includes a first resin layer provided on one principal surface of the circuit board, and a second resin layer provided on the first resin layer and embedding the multilayer capacitor. In the multilayer capacitor built-in substrate according to the fourth preferred embodiment of the present invention, the circuit board further includes a third insulating layer having a Young's modulus larger than that of the second insulating layer at a position closer to the principal surface on which the multilayer ceramic capacitor is mounted than the second insulating layer. In other words, the second insulating layer having the lower Young's modulus is sandwiched between the first insulating layer and the third insulating layer each having the higher Young's modulus.

The following describes a case in which a land is provided on the surface of the third insulating layer and the multilayer ceramic capacitor is mounted on the land on the third insulating layer. In this case, the third insulating layer having the higher Young's modulus is an insulating layer including a principal surface on which the multilayer ceramic capacitor is mounted.

Figure 5:
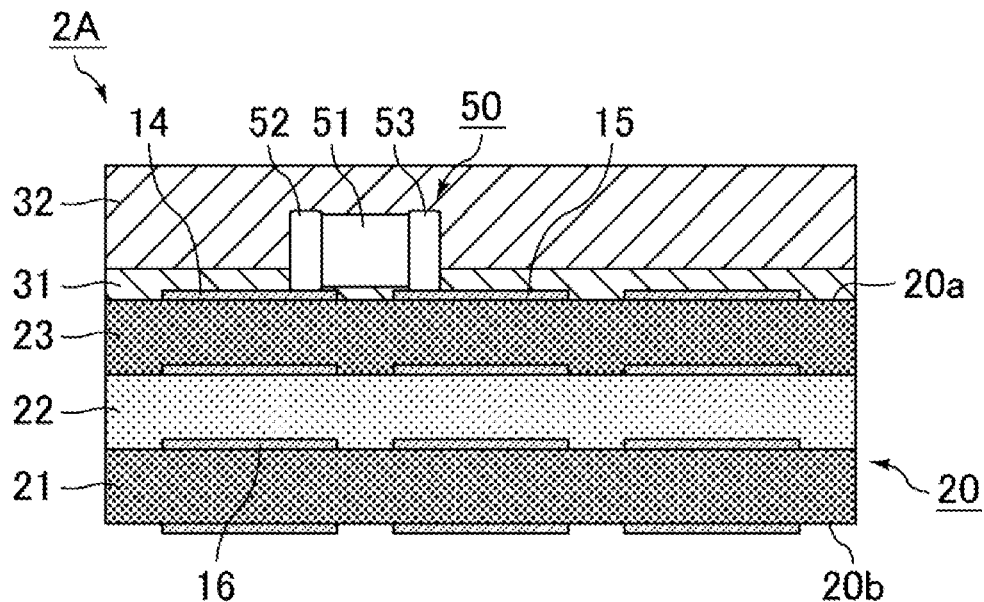
FIG. 5 is a cross-sectional view schematically illustrating an exemplary multilayer capacitor built-in substrate according to a fourth preferred embodiment of the present invention.

FIG. 5 is a cross-sectional view schematically illustrating an exemplary multilayer capacitor built-in substrate according to the fourth preferred embodiment of the present invention.

The multilayer capacitor built-in substrate 2A illustrated in FIG. 5 includes the circuit board 20, the multilayer ceramic capacitor 50, the first resin layer 31, and the second resin layer 32.

Although not illustrated in FIG. 5, a conductive portion may be additionally provided on the surface of the second resin layer 32.

The multilayer ceramic capacitor 50 is mounted on the one principal surface 20a of the circuit board 20. The first resin layer 31 is provided on the one principal surface 20a of the circuit board 20. The second resin layer 32 is provided on the first resin layer 31 and embeds the multilayer ceramic capacitor 50.

Figure 6:
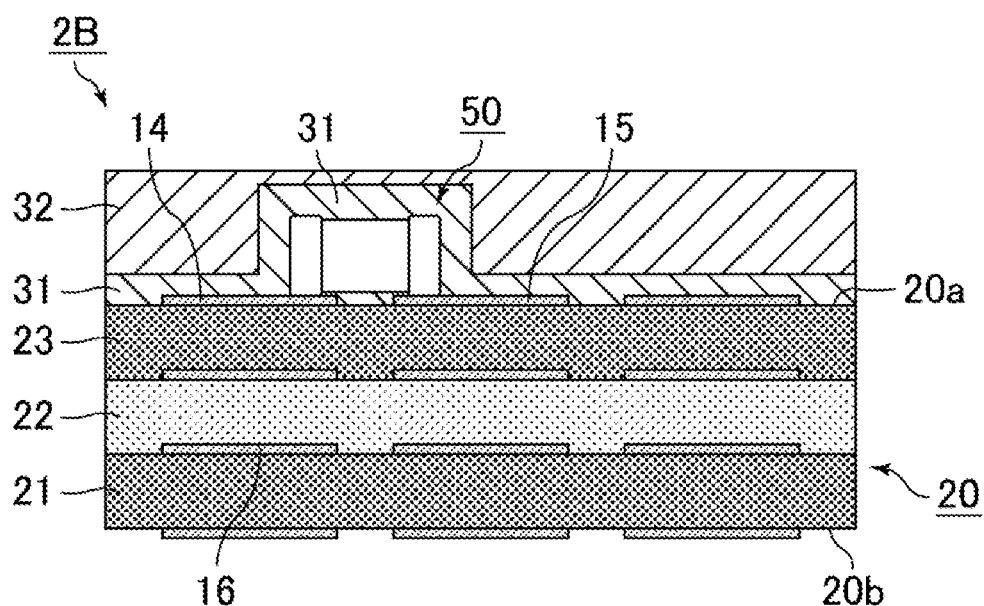
FIG. 6 is a cross-sectional view schematically illustrating another exemplary multilayer capacitor built-in substrate according to the fourth preferred embodiment of the present invention.

FIG. 6 is a cross-sectional view schematically illustrating another exemplary multilayer capacitor built-in substrate according to the fourth preferred embodiment of the present invention.

In the multilayer capacitor built-in substrate 2B illustrated in FIG. 6, the first resin layer 31 is provided on the upper surface and the side surface of the multilayer ceramic capacitor 50 to cover the multilayer ceramic capacitor 50.

In the multilayer capacitor built-in substrate according to the fourth preferred embodiment of the present invention, the configuration of the multilayer ceramic capacitor is the same or substantially the same as that of the multilayer capacitor built-in substrate according to the third preferred embodiment of the present invention.

In FIGS. 5 and 6, the circuit board 20 preferably has a flat plate shape as a whole, and includes the third insulating layer 23, the second insulating layer 22, and the first insulating layer 21 in order from the principal surface 20a on which the multilayer ceramic capacitor 50 is mounted and toward the principal surface 20b on which no multilayer ceramic capacitor 50 is mounted. The first insulating layer 21 is adjacent to the second insulating layer 22, and the second insulating layer 22 is adjacent to the third insulating layer 23.

The circuit board 20 further includes the lands 14 and 15 defining conductive patterns, and the wire conductor 16. The lands 14 and 15 are provided on the surface of the third insulating layer 23, and the multilayer ceramic capacitor 50 is mounted on the lands 14 and 15 on the third insulating layer 23.

In the multilayer capacitor built-in substrate according to the fourth preferred embodiment of the present invention, the configuration of the circuit board is the same or substantially the same as that of the multilayer capacitor built-in substrate according to the third preferred embodiment of the present invention except that the first insulating layer, the second insulating layer, and the third insulating layer are disposed in a different order.

Accordingly, in the preferable material and Young's modulus of the first insulating layer, the preferable material, Young's modulus, and thickness of the second insulating layer, and the preferable material and Young's modulus of the third insulating layer are the same or substantially the same as those of the multilayer capacitor built-in substrate according to the third preferred embodiment of the present invention.

In the multilayer capacitor built-in substrate according to the fourth preferred embodiment of the present invention, the configurations of the first resin layer and the second resin layer are the same or substantially the same as those of the multilayer capacitor built-in substrate according to the third preferred embodiment of the present invention.

Accordingly, the preferable material, Young's modulus, and thickness of the first resin layer, and the preferable material, Young's modulus, and thickness of the second resin layer are the same or substantially the same as those of the multilayer capacitor built-in substrate according to the first preferred embodiment of the present invention.

The structures of the multilayer capacitor built-in substrates illustrated in FIGS. 5 and 6 are merely examples of the multilayer capacitor built-in substrate according to the fourth preferred embodiment of the present invention. The number of laminated insulating layers, disposition of a conductive pattern, and other features and characteristics may be changed in various manners as long as the second insulating layer having the lower Young's modulus is sandwiched between the first insulating layer and the third insulating layer each having the higher Young's modulus.

For example, the multilayer ceramic capacitor does not need to be mounted on a land on the third insulating layer, but an insulating layer having a Young's modulus smaller than the Young's modulus of the third insulating layer may be disposed closer to the principal surface on which the multilayer ceramic capacitor is mounted than the third insulating layer, and the multilayer ceramic capacitor may be mounted on a land on the insulating layer. The first insulating layer does not need to be adjacent to the second insulating layer, and the second insulating layer does not need to be adjacent to the third insulating layer. In addition, another insulating layer may be disposed closer to the principal surface on which no multilayer ceramic capacitor is mounted than the first insulating layer.

When another insulating layer other than the first insulating layer, the second insulating layer, and the third insulating layer is disposed, the Young's modulus of the other insulating layer is preferably larger than the Young's modulus of the second insulating layer, and more preferably equal or substantially equal to the Young's modulus of the first insulating layer, similarly to that of the third insulating layer. Thus, an insulating layer included in the principal surface on which no multilayer ceramic capacitor is mounted preferably has a higher Young's modulus.

Fifth Preferred Embodiment

In a multilayer capacitor built-in substrate according to a fifth preferred embodiment of the present invention, the resin layer on the circuit board includes a single layer unlike the multilayer capacitor built-in substrates according to the third and fourth preferred embodiments of the present invention.

Figure 7:
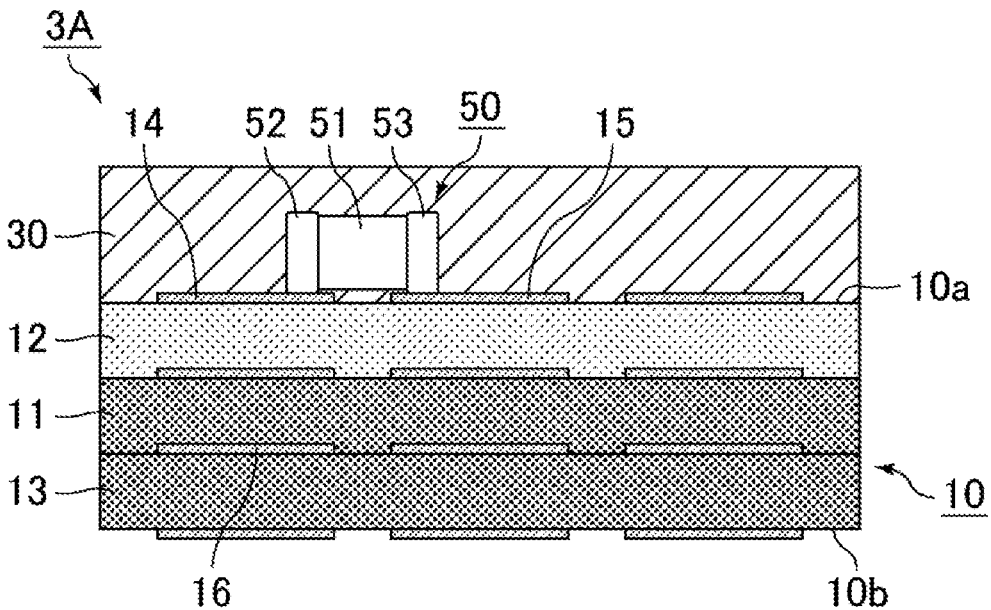
FIG. 7 is a cross-sectional view schematically illustrating an exemplary multilayer capacitor built-in substrate according to a fifth preferred embodiment of the present invention.

FIG. 7 is a cross-sectional view schematically illustrating an exemplary multilayer capacitor built-in substrate according to the fifth preferred embodiment of the present invention.

This multilayer capacitor built-in substrate 3A illustrated in FIG. 7 includes the circuit board 10, the multilayer ceramic capacitor 50, and a resin layer 30. Although not illustrated in FIG. 7, a conductive portion may be further provided on the surface of the resin layer 30.

The multilayer ceramic capacitor 50 is mounted on the one principal surface 10a of the circuit board 10. The resin layer 30 is provided on the one principal surface 10a of the circuit board 10 and embeds the multilayer ceramic capacitor 50.

Figure 8:
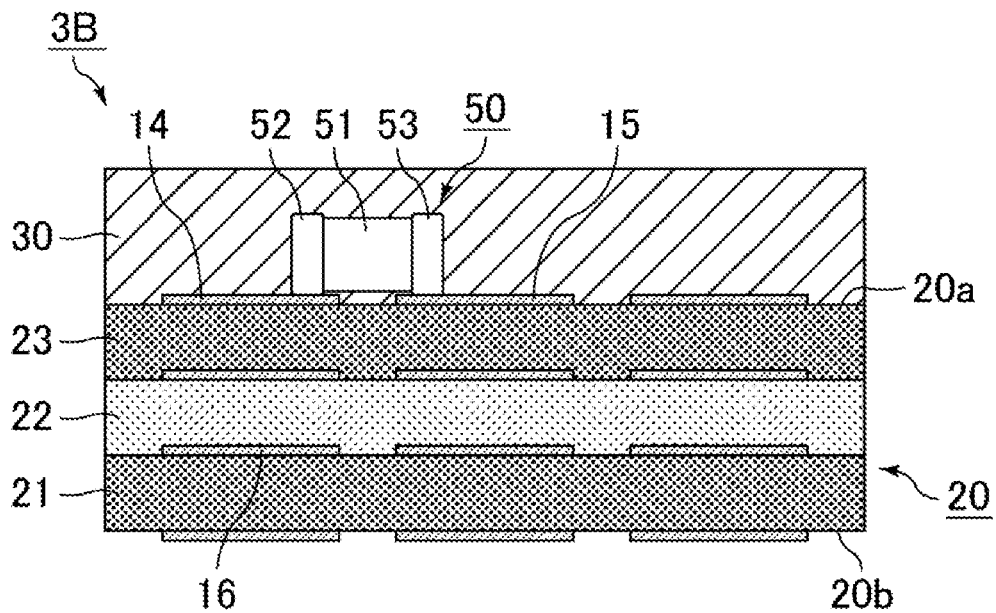
FIG. 8 is a cross-sectional view schematically illustrating another exemplary multilayer capacitor built-in substrate according to the fifth preferred embodiment of the present invention.

FIG. 8 is a cross-sectional view schematically illustrating another exemplary multilayer capacitor built-in substrate according to the fifth preferred embodiment of the present invention.

The multilayer capacitor built-in substrate 3B illustrated in FIG. 8 includes the circuit board 20, the multilayer ceramic capacitor 50, and the resin layer 30. Although not illustrated in FIG. 8, a conductive portion may be further provided on the surface of the resin layer 30.

The multilayer ceramic capacitor 50 is mounted on the one principal surface 20a of the circuit board 20. The resin layer 30 is provided on the one principal surface 20a of the circuit board 20 and embeds the multilayer ceramic capacitor 50.

Except that the resin layer includes a single layer, the multilayer capacitor built-in substrate 3A illustrated in FIG. 7 has the same or substantially the same configuration as that of the multilayer capacitor built-in substrate 1A illustrated in FIG. 3, and the multilayer capacitor built-in substrate 3B illustrated in FIG. 8 has the same or substantially the same configuration as that of the multilayer capacitor built-in substrate 2A illustrated in FIG. 5.

Accordingly, in the multilayer capacitor built-in substrate according to the fifth preferred embodiment of the present invention, the configuration of the multilayer ceramic capacitor is the same or substantially the same as that of the multilayer capacitor built-in substrate according to the third preferred embodiment of the present invention, and the configuration of the circuit board is the same or substantially the same as that of the multilayer capacitor built-in substrate according to the third or fourth preferred embodiment of the present invention.

In the multilayer capacitor built-in substrate according to the fifth preferred embodiment of the present invention, the resin layer is preferably provided entirely or substantially entirely on the principal surface of the circuit board on which the multilayer ceramic capacitor is mounted. In other words, the principal surface of the circuit board on which the multilayer ceramic capacitor is mounted is preferably covered by the resin layer.

The material of the resin layer may preferably be, for example, a resin material such as epoxy resin, polyimide resin, or urethane resin, or a material obtained by adding, to these resin materials, a filler made of an inorganic material or an organic material. The resin layer preferably includes a thermosetting resin material, and more preferably contains epoxy resin.

The Young's modulus of the resin layer is not particularly limited, but is preferably about 10 GPa or larger, and more preferably about 15 GPa or larger, for example, and is also preferably about 30 GPa or smaller, and more preferably about 25 GPa or smaller, for example.

The thickness of the resin layer is not particularly limited as long as it is enough to embed the multilayer ceramic capacitor, but is preferably, for example, about 300 µm or larger, and more preferably about 500 µm or larger, and is also preferably about 1 mm or smaller, and more preferably about 800 µm or smaller.

The preferred embodiments of the multilayer capacitor built-in substrates according to the present invention are described above, but the multilayer capacitor built-in substrates according to the present invention is not limited to the above-described preferred embodiments.

In the multilayer capacitor built-in substrates according to preferred embodiments of the present invention, the number of laminated resin layers may be changed in various manners as long as a resin layer is provided on one principal surface of the circuit board on which the multilayer capacitor is mounted so that the resin layer embeds the multilayer capacitor.

For example, in the multilayer capacitor built-in substrates according to the third and fourth preferred embodiments of the present invention, the first resin layer does not need to be adjacent to the second resin layer, and a resin layer having a Young's modulus smaller than that of the first resin layer may be disposed between the first resin layer and the second resin layer. Another resin layer may be provided on the second resin layer.

In the multilayer capacitor built-in substrates according to preferred embodiments of the present invention, when alternating-current voltage or direct-current voltage with an alternating-current component superimposed thereon is applied to the multilayer capacitor, vibrations of the entire multilayer capacitor built-in substrate are reduced so that noise from the circuit board is reduced. Thus, the circuit boards included in the multilayer capacitor built-in substrates according to preferred the present invention are preferably provided with a conductive pattern to which alternating-current voltage or direct-current voltage with an alternating-current component superimposed thereon is applied, and particularly, substrates provided with conductive patterns with which the voltage applied to the multilayer capacitor varies at a frequency in the audible frequency range of 20 Hz to 20,000 Hz inclusive.

Although in the above-described preferred embodiments, a configuration in which one multilayer capacitor is mounted on one principal surface of the circuit board, has been described, the present invention also includes a configuration in which a plurality of multilayer capacitors are mounted on one principal surface of the circuit board. In addition, an electronic component other than a multilayer capacitor may be mounted on the circuit board.

The following describes a case in which multilayer capacitors are mounted on both principal surfaces of the circuit board in a multilayer capacitor built-in substrate according to a preferred embodiment of the present invention.

First, when the number of mounted multilayer capacitors is different between both principal surfaces, a principal surface on which the larger number of multilayer capacitors are mounted is referred to as a "principal surface on which multilayer capacitors are mounted", and the other principal surface on which the smaller number of multilayer capacitors are mounted is referred to as a "principal surface on which no multilayer capacitors are mounted". In this case, a preferred embodiment of the present invention includes a configuration in which an insulating layer having the lower Young's modulus is disposed closer to the principal surface on which multilayer capacitors are mounted, and an insulating layer having the higher Young's modulus is disposed closer to the principal surface on which no multilayer capacitors are mounted. In this case, the number of multilayer capacitors closer to the "principal surface on which multilayer capacitors are mounted" is preferably about five times larger than the number of multilayer capacitors closer to the "principal surface on which no multilayer capacitors are mounted".

When the number of mounted multilayer capacitors is the same or substantially the same between both principal surfaces, each principal surface is referred to as a "principal surface on which multilayer capacitors are mounted". In this case, a preferred embodiment of the present invention includes a configuration in which an insulating layer having the lower Young's modulus is disposed closer to the principal surface on which multilayer capacitors are mounted, and an insulating layer having the higher Young's modulus is disposed closer to the opposite principal surface.

Thus, for example, in the multilayer capacitor built-in substrate according to the fourth preferred embodiment of the present invention, multilayer capacitors may be mounted on both principal surfaces when insulating layers at both principal surfaces have the higher Young's modulus and an insulating layer disposed therebetween has the lower Young's modulus.

Even when an insulating layer having the higher Young's modulus is disposed at one principal surface, and an insulating layer having the lower Young's modulus is disposed at the other principal surface, a configuration in which an insulating layer having the lower Young's modulus is disposed other than the insulating layer at the other principal surface and sandwiched between the insulating layers having the higher Young's modulus is able to be recognized as a combination of the multilayer capacitor built-in substrates according to the third and fourth preferred embodiments of the present invention, and thus multilayer capacitors may be mounted on both principal surfaces.

In the multilayer capacitor built-in substrate according to the third preferred embodiment of the present invention, multilayer capacitors may be mounted on both principal surfaces when insulating layers at both principal surfaces have the lower Young's modulus and an insulating layer disposed therebetween has the higher Young's modulus.

The following describes examples more specifically disclosing the mounting structures according to preferred embodiments of the present invention. The present invention is not limited to these examples.

FIG. 9 is a table listing the configuration of a mounting structure in each exemplary experiment.

Each exemplary experiment used a multilayer ceramic capacitor having the 1005 size (about 1.0 mm×about 0.5 mm; the thickness: about 0.5 mm) and a capacitance of about 10 µF. The multilayer ceramic capacitor was mounted on a copper land (thickness: about 0.018 mm) on a circuit board.

In each exemplary experiment, the circuit board included insulating layers configured as follows.

Exemplary Experiment A: only includes a glass epoxy resin layer L1 (Young's modulus: about 25 GPa; the same in the other exemplary experiments).

Exemplary Experiment B: includes the glass epoxy resin layer L1 and an epoxy resin layer L2 (Young's modulus: about 0.1 GPa to 100 GPa inclusive; the same in the other exemplary experiments) in the stated order from a principal surface on which the multilayer ceramic capacitor is mounted.

Exemplary Experiment C: includes the epoxy resin layer L2 and the glass epoxy resin layer L1 in the stated order from the principal surface on which the multilayer ceramic capacitor is mounted.

Exemplary Experiment D: includes a glass epoxy resin layer L3 (Young's modulus: about 25 GPa), the epoxy resin layer L2, and the glass epoxy resin layer L1 in the stated order from the principal surface on which the multilayer ceramic capacitor is mounted.

FIG. 9 lists a thickness t1 of the glass epoxy resin layer L1, a thickness t2 of the epoxy resin layer L2, a thickness t3 of the glass epoxy resin layer L3, and a total thickness t0 of the resin layers.

Vibration analysis by a finite element method was performed on the mounting structure in each exemplary experiment.

Figure 10:
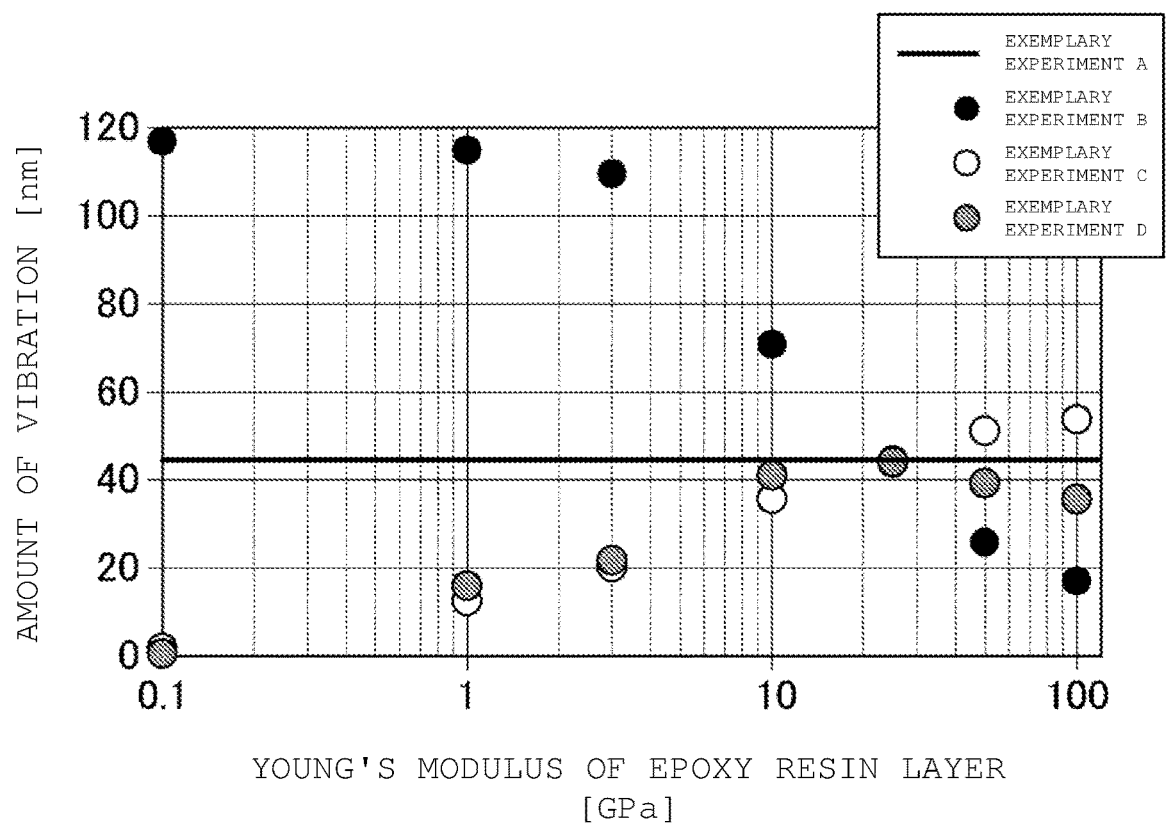
FIG. 10 illustrates a simulation result indicating the relationship between the Young's modulus of an epoxy resin layer in each exemplary experiment and the amount of vibration.

FIG. 10 illustrates a simulation result indicating the relation between the Young's modulus of the epoxy resin layer and the amount of vibration in each exemplary experiment.

In FIG. 10, Exemplary Experiment A only includes a glass epoxy resin layer as an insulating layer, and thus corresponds to a comparative example. Among plots of Exemplary Experiment B, a plot at which the Young's modulus of the epoxy resin layer is equal to or smaller than the Young's modulus (about 25 GPa) of the glass epoxy resin layer corresponds to a comparative example, and a plot at which the Young's modulus of the epoxy resin layer is larger than that of the glass epoxy resin layer corresponds to an example. Among plots of Exemplary Experiment C, a plot at which the Young's modulus of the epoxy resin layer is smaller than that of the glass epoxy resin layer corresponds to an example, and a plot at which the Young's modulus of the epoxy resin layer is equal to or larger than that of the glass epoxy resin layer corresponds to a comparative example. Among plots of Exemplary Experiment D, a plot at which the Young's modulus of the epoxy resin layer is equal to that of the glass epoxy resin layer corresponds to a comparative example, and any other plots correspond to an example.

As understood from FIG. 10, the amount of vibration was about 44 nm for Exemplary Experiment A including no epoxy resin layer, but the amount of vibration for Exemplary Experiment B having a configuration in which the Young's modulus of the epoxy resin layer is smaller than that of the glass epoxy resin layer was larger than that for Exemplary Experiment A. As the reason, it is presumed that the circuit board was more flexible as a whole so that the entire circuit board largely vibrated.

The amount of vibration for Exemplary Experiment C having a configuration in which the Young's modulus of the epoxy resin layer is smaller than that of the glass epoxy resin layer was smaller than that for Exemplary Experiment A. The amount of vibration for Exemplary Experiment B having a configuration in which the Young's modulus of the epoxy resin layer is larger than that of the glass epoxy resin layer was smaller than that for Exemplary Experiment A.

As the reason, it is presumed that propagation of vibration attributable to distortion of the multilayer ceramic capacitor to a layer having the larger Young's modulus was hindered through a layer having the smaller Young's modulus.

In addition, the amount of vibration for Exemplary Experiment D having a configuration in which the Young's modulus of the epoxy resin layer is smaller than that of the glass epoxy resin layer was smaller than that for Exemplary Experiment A.

As the reason, it is presumed that vibration attributable to distortion of the multilayer ceramic capacitor first propagated to a layer having the larger Young's modulus, but propagation of the vibration to the other layer having the larger Young's modulus was hindered through a layer having the smaller Young's modulus.

The amount of vibration for Exemplary Experiment D having a configuration in which the Young's modulus of the epoxy resin layer is larger than that of the glass epoxy resin layer was smaller than that for Exemplary Experiment A.

As the reason, similarly to Exemplary Experiment C having a configuration in which the Young's modulus of the epoxy resin layer is smaller than that of the glass epoxy resin layer, it is presumed that propagation of vibration attributable to distortion of the multilayer ceramic capacitor to a layer having the larger Young's modulus was hindered through a layer having the smaller Young's modulus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounting structure comprising:
a circuit board including one principal surface on which a multilayer capacitor is mounted; wherein
the circuit board includes a first insulating layer, and a second insulating layer having a Young's modulus smaller than a Young's modulus of the first insulating layer;
the second insulating layer is disposed closer to the one principal surface on which the multilayer capacitor is mounted than the first insulating layer;
a land is provided on the one principal surface of the circuit board; and
the multilayer capacitor is mounted on the land on the one principal surface.

2. The mounting structure according to claim 1, wherein the one principal surface is a surface of the second insulating layer; and
the multilayer capacitor is mounted on the land on the second insulating layer.

3. The mounting structure according to claim 1, wherein the circuit board further includes a third insulating layer having a Young's modulus larger than the Young's modulus of the second insulating layer; and
the third insulating layer is disposed closer to the one principal surface on which the multilayer capacitor is mounted than the second insulating layer.

4. The mounting structure according to claim 3, wherein the one principal surface is a surface of the third insulating layer; and
the multilayer capacitor is mounted on the land on the third insulating layer.

5. The mounting structure according to claim 1, wherein E2/E1<about 0.5 is satisfied where the Young's modulus of the first insulating layer is represented by E1, and the Young's modulus of the second insulating layer is represented by E2.

6. The mounting structure according to claim 1, wherein t2/t0≥about 0.08 is satisfied where a total thickness of an insulating layer included in the circuit board is represented by t0, and a thickness of the second insulating layer is represented by t2.

7. The mounting structure according to claim 1, wherein the first insulating layer includes glass epoxy resin, and the second insulating layer includes epoxy resin.

8. A multilayer capacitor built-in substrate including:
a circuit board;
a multilayer capacitor mounted on one principal surface of the circuit board; and
a resin layer provided on the one principal surface of the circuit board and embedding the multilayer capacitor; wherein
the circuit board includes a first insulating layer, and a second insulating layer having a Young's modulus smaller than a Young's modulus of the first insulating layer; and
the second insulating layer is disposed closer to the principal surface on which the multilayer capacitor is mounted than the first insulating layer.

9. The multilayer capacitor built-in substrate according to claim 8, wherein
a land is provided on a surface of the second insulating layer; and
the multilayer capacitor is mounted on the land on the second insulating layer.

10. The multilayer capacitor built-in substrate according to claim 8, wherein
the circuit board further includes a third insulating layer having a Young's modulus larger than the Young's modulus of the second insulating layer; and
the third insulating layer is disposed closer to the principal surface on which the multilayer capacitor is mounted than the second insulating layer.

11. The multilayer capacitor built-in substrate according to claim 10, wherein
a land is provided on a surface of the third insulating layer; and the multilayer capacitor is mounted on the land on the third insulating layer.

12. The multilayer capacitor built-in substrate according to claim 8, wherein $Ei2/Ei1 <$ about 0.5 is satisfied where the Young's modulus of the first insulating layer is represented by $Ei1$, and the Young's modulus of the second insulating layer is represented by $Ei2$.

13. The multilayer capacitor built-in substrate according to claim 8, wherein $ti2/ti0 \geq$ about 0.08 is satisfied where a total thickness of the insulating layers included in the circuit board is represented by $ti0$, and a thickness of the second insulating layer is represented by $ti2$.

14. The multilayer capacitor built-in substrate according to claim 8, wherein the first insulating layer includes glass epoxy resin, and the second insulating layer includes epoxy resin.

15. The multilayer capacitor built-in substrate according to claim 8, wherein
the resin layer includes a first resin layer provided on the one principal surface of the circuit board, and a second resin layer provided on the first resin layer and embedding the multilayer capacitor; and
a Young's modulus of the first resin layer is smaller than a Young's modulus of the second resin layer.

16. The multilayer capacitor built-in substrate according to claim 15, wherein the first resin layer is also provided on an upper surface and a side surface of the multilayer capacitor to cover the multilayer capacitor.

17. The multilayer capacitor built-in substrate according to claim 15, wherein $Er1/Er2<$ about 0.5 is satisfied where the Young's modulus of the first resin layer is represented by $Er1$, and the Young's modulus of the second resin layer is represented by $Er2$.

18. The multilayer capacitor built-in substrate according to claim 15, wherein a thickness of the first resin layer is smaller than a thickness of the multilayer capacitor.

19. The multilayer capacitor built-in substrate according to claim 15, wherein the first resin layer and the second resin layer each include epoxy resin.

20. The multilayer capacitor built-in substrate according to claim 8, wherein the resin layer includes a single layer.

21. The multilayer capacitor built-in substrate according to claim 20, wherein the resin layer includes epoxy resin.

* * * * *